United States Patent
Rosenow et al.

(10) Patent No.: US 12,041,844 B2
(45) Date of Patent: Jul. 16, 2024

(54) ORGANIC LIGHT EMITTING DEVICE

(71) Applicant: Novaled GmbH, Dresden (DE)

(72) Inventors: Thomas Rosenow, Dresden (DE); Markus Hummert, Dresden (DE)

(73) Assignee: Novaled GmbH, Dresden (DE)

( * ) Notice: Subject to any disclaimer, the term of this patent is extended or adjusted under 35 U.S.C. 154(b) by 694 days.

(21) Appl. No.: 17/284,511

(22) PCT Filed: Oct. 4, 2019

(86) PCT No.: PCT/EP2019/076882
§ 371 (c)(1),
(2) Date: Apr. 12, 2021

(87) PCT Pub. No.: WO2020/074379
PCT Pub. Date: Apr. 16, 2020

(65) Prior Publication Data
US 2021/0376258 A1  Dec. 2, 2021

(30) Foreign Application Priority Data
Oct. 12, 2018  (DE) .................. 102018125307.9

(51) Int. Cl.
H01L 51/00 (2006.01)
H10K 85/30 (2023.01)
H10K 50/11 (2023.01)
H10K 50/15 (2023.01)
H10K 50/17 (2023.01)
H10K 101/10 (2023.01)

(52) U.S. Cl.
CPC ............ H10K 85/30 (2023.02); H10K 50/11 (2023.02); H10K 50/15 (2023.02); H10K 50/17 (2023.02); H10K 2101/10 (2023.02)

(58) Field of Classification Search
CPC .. H01L 51/52; H01L 51/0077; H01L 51/5088
See application file for complete search history.

(56) References Cited

U.S. PATENT DOCUMENTS

| | | | |
|---|---|---|---|
| 10,910,571 B2 | 2/2021 | Kessler et al. | |
| 2007/0170421 A1 | 7/2007 | Liao et al. | |
| 2011/0210317 A1 | 9/2011 | Song et al. | |
| 2014/0001444 A1 | 1/2014 | Kim et al. | |
| 2014/0077189 A1 | 3/2014 | Kugler et al. | |
| 2014/0246661 A1* | 9/2014 | Yoon ..................... B82Y 10/00 257/40 |
| 2018/0033995 A1 | 2/2018 | Kim et al. | |
| 2018/0240996 A1 | 8/2018 | Hummert et al. | |
| 2020/0052210 A1 | 2/2020 | Heggemann et al. | |

FOREIGN PATENT DOCUMENTS

| | | |
|---|---|---|
| CN | 101005116 A | 7/2007 |
| CN | 101617417 A | 12/2009 |
| EP | 3133663 A1 | 2/2017 |
| EP | 3503233 A1 | 6/2019 |
| GB | 2527606 | 12/2015 |
| JP | 2008182237 A | 8/2008 |
| JP | 2009200493 A | 9/2009 |
| JP | 2016076572 A | 5/2016 |
| KR | 100864140 B1 | 10/2008 |
| KR | 20130007308 A | 1/2013 |

OTHER PUBLICATIONS

Notice of Reasons for Refusal issued in Japan application No. 2021-519563, dated Apr. 25, 2023, 7 pages.
Notice to File a Response issued in Korean application No. 10-2021-7014062, dated Oct. 25, 2023 (4 pages).
Notification of First Office Action issued in China application No. 201980066243.6, dated Nov. 20, 2023 (12 pages).
Office Action mailed by German Patent and Trademark Office on Jul. 10, 2019 in application No. 10 2018 125 307.9.
PCT International Search Report and Written Opinion for PCT Application No. PCT/EP2019/076682 mailed Jan. 3, 2020 (9 pages).
Notification of the Second Office Action issued in China application No. 201980066243.6, dated Apr. 3, 2024 (22 pages).

* cited by examiner

Primary Examiner — Robert D Harlan
(74) Attorney, Agent, or Firm — Eversheds Sutherland (US) LLP

(57) ABSTRACT

The present Invention relates to an organic light emitting device comprising: (i) an anode; (ii) a cathode; (iii) at least one light emitting layer arranged between the anode and the cathode; (iv) optionally a first hole injection layer comprising a first hole injection compound, the first hole injection layer being arranged between the anode and the light emitting layer and the hole injection layer being adjacent to the anode; (v) a first hole transport layer comprising a first hole transport matrix compound wherein the first hole transport layer is arranged a) between the first hole injection layer and the light emitting layer and adjacent to the first hole injection layer; or b) between the anode and the light emitting layer and adjacent to the anode; (vi) a second hole injection layer arranged between the first hole transport layer and the light emitting layer, wherein the second hole injection layer is adjacent to the first hole transport layer and wherein the second hole injection layer comprises a second hole injection compound; wherein the second hole injection compound is a halo-genated fullerene, a partially or fully halogenated metal complex or a mixture thereof.

10 Claims, 2 Drawing Sheets

ORGANIC LIGHT EMITTING DEVICE

CROSS REFERENCE TO RELATED APPLICATIONS

This application is a U.S. national phase application of PCT/EP2019/076882, filed Oct. 4, 2019, which claims priority to German Application No. 102018125307.9, filed Oct. 12, 2018. The content of these applications is incorporated herein by reference.

The present invention relates to an organic light emitting device optimized with respect to the electronic properties of the layer structure thereof.

BACKGROUND ART

Organic light-emitting diodes (OLEDs), which are self-emitting devices, have a wide viewing angle, excellent contrast, quick response, high brightness, excellent driving voltage characteristics, and color reproduction. A ideal OLED includes an anode, a hole transport layer (HTL), an emission layer (EML), an electron transport layer (ETL), and a cathode, which are sequentially stacked on a substrate. In this regard, the HTL, the EML, and the ETL are thin films is formed from organic and/or organometallic compounds.

When a voltage is applied to the anode and the cathode, holes injected from the anode electrode move to the EML, via the HTL, and electrons injected from the cathode electrode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency.

Organic light emitting devices may comprise hole injection layers and/or p-doped hole transport layers exploiting as p-dopants and/or hole injection materials compounds having (in an absolute energy scale conventionally setting vacuum energy level equal zero) energy level of their lowest unoccupied molecular orbital (LUMO) about 3 eV below the vacuum level or deeper. Well known compounds in this regard are organic small molecule compounds comprising one or (preferably) more nitrile functional groups. These materials are represented e.g. by hexacyano-hexaazatriphenylene (CNHAT)

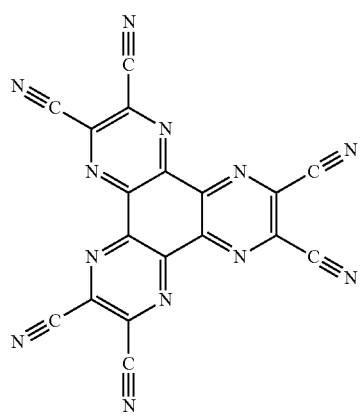 [SMILES: N#Cc1nc2c3nc(C#N)c(C#N)nc3c3nc(C#N)c(C#N)nc3c2nc1C#N]

or by the following compounds

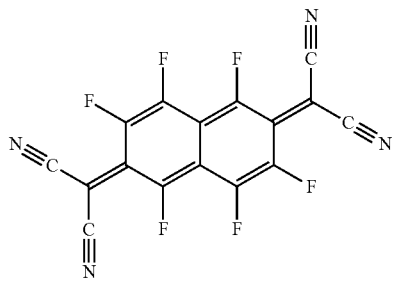

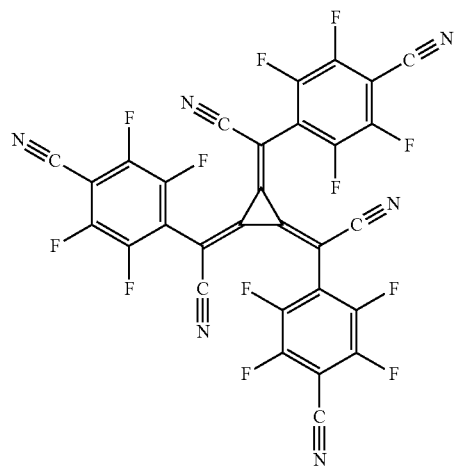

which became kind of an industrial standard.

As shown in the application US 2014/001444 A1, it may be advantageous that, instead of and/or additionally to a first hole injection layer which is usually arranged adjacent to the anode, the electroluminescent device comprises a second hole injection layer arranged between the anode and the emission layer, wherein the second injection layer is not adjacent to the anode.

However, there is still a need to improve the performance of organic light emitting devices with the aim that operational voltage is as low as possible while the efficiency of the device is as high as possible.

It is, therefore, the object of the present invention to provide an organic light emitting device overcoming drawbacks of the prior art, in particular an organic light emitting device having improved operational voltage and/or efficiency.

SUMMARY OF THE INVENTION

The above object is achieved by an organic light emitting device comprising: (i) an anode; (ii) a cathode; (iii) at least one light emitting layer arranged between the anode and the cathode; (iv) optionally a first hole injection layer comprising a first hole injection compound, the first hole injection layer being arranged between the anode and the light emitting layer and the hole injection layer being adjacent to the anode; (v) a first hole transport layer comprising a first hole transport matrix compound, wherein the first hole transport layer is arranged a) between the first hole injection layer and the light emitting layer and adjacent to the first hole injection layer; or b) between the anode and the light emitting layer and adjacent to the anode; (vi) a second hole injection layer arranged between the first hole transport layer and the light emitting layer, wherein the second hole injection layer is adjacent to the first hole transport layer and wherein the second hole injection layer comprises a second hole injection compound; wherein the second hole injection compound is a fullerene, a partially or fully halogenated metal complex or a mixture thereof.

It was surprisingly found by the inventors that an organic light emitting device in accordance with the invention comprising halogenated fullerenes and/or partially or fully halogenated metal complexes in the second hole injection layer (as defined herein) thereof have improved characteristics, in particular may feature lower operational voltage and/or higher efficiency. Furthermore, it is a finding of the inventors that the above-mentioned compounds provide a broader design freedom when preparing organic light emitting devices.

A fullerene per se is an allotrope of carbon in the form of a hollow sphere, ellipsoid, tube and many other shapes. Fullerenes are similar in structure to graphite. Unless they are cylindrical, the must also contain pentagonal (or sometimes heptagonal) rings besides hexagonal rings. In terms of the invention, a halogenated fullerene is a fullerene derivative achieved by addition of an odd number of halogen atoms to a fullerene i.e. a compound having the general formula $C_xX_y$, wherein x is an even number equal or higher than 60, y is an even number lower than x, and each X is independently selected from F, Cl, Br and I.

In terms of the present invention, the "metal complex" may be an organic metal complex, i.e. a complex comprising at least one organic ligand, i.e. a group capable of providing a donative bond and further comprising at least one hydrocarbyl group, wherein the atom capable of providing a donative bond provides the donative bond (=coordinate covalent bond or coordinate bond) to the at least one metal ion comprised in the metal complex. It may be provided that the inventive metal complex consists of one central atom or ion which is the so-called coordination center. The coordination center is surrounded by bound molecules or ions (preferably organic molecules or ions) that are, in turn, known as ligands or complexing agents. In terms of the present invention, a partially halogenated metal complex may be such a metal complex comprising organic ligands, wherein at least one but not all of the hydrogen atoms comprised therein are substituted by halogen atoms. Likewise, a fully halogenated metal complex may be such a metal complex comprising hydrocarbyl containing ligands, wherein in the ligands all of the hydrogen atoms are replaced by halogen atoms.

In the inventive organic light emitting device, the first hole injection layer may further comprise a second hole transport matrix compound. In this way, further advantages with respect to operational voltage and/or efficiency of the device may be achieved.

In the inventive organic light emitting device, the second hole injection layer may further comprise a third hole transport matrix compound. In this way, further advantages with respect to operational voltage and/or efficiency of the device may be achieved.

The organic light emitting device may further comprise a second hole transport layer arranged between the second hole injection layer and the light emitting layer, wherein the second hole transport layer is adjacent to the second hole injection layer and wherein the second hole transport layer comprises a fourth hole transport matrix compound. In this way, further advantages with respect to operational voltage and/or efficiency of the device may be achieved.

In terms of the present invention, a halogenated compound may be a fluorinated compound, i.e. a partially halogenated compound may be a partially fluorinated compound and a fully halogenated compound may be a fully fluorinated compound. In other words, the halogenated fullerene may be a fluorinated fullerene, the partially halogenated metal complex may be a partially fluorinated metal complex and the fully halogenated metal complex may be a fully fluorinated metal complex. In this way, further advantages with respect to operational voltage and/or efficiency of the device may be achieved.

In the organic light emitting device, the halogenated fullerene may have the formula $C_xF_y$, wherein x is an even integer from 60 to 120 and y is an even integer from x/2 to 4x/5. In this way, further advantages with respect to operational voltage and/or efficiency of the device may be achieved.

In this regard, it may be provided that x is 60, i.e. that the halogenated fullerene is a halogenated $C_{60}$ fullerene (a fullerene having 60 carbon atoms). In this way, further advantages with respect to operational voltage and/or efficiency of the device may be achieved.

The halogenated fullerene may further have the formula $C_{60}F_{48}$. In this way, further advantages with respect to operational voltage and/or efficiency of the device may be achieved.

The partially or fully halogenated metal complex may have the formula (I)

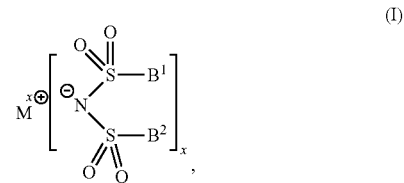

(I)

wherein

Mx is a x-valent cation of a metal selected from alkali metals, alkaline earth metals, rare ea metals and Al, Ga, In, Sn, Pb, Ti, Zr, Hf, V, Ta, Cr, Mo, W, Mn, Fe, Co, Ni, Zn and Cd; x is 1 for M selected from alkali metals; 2 for M selected from alkaline earth metals, Pb, Mn, Fe, Co, Ni, Zn and Cd; 2 or 3 for M selected from rare earth metals; 3 for Al, Ga, In; 2, 3 or 4 for Ti, Zr, Hf, V, Ta, Cr, Mo, W; and 2 or 4 for Sn; B1 and B2 is independently selected from partially or fully halogenated $C_3$ to $C_{20}$ alkyl, $C_3$ to $C_{20}$ cycloalkyl or $C_3$ to $C_{20}$ arylalkyl. In this way, further advantages with respect to operational voltage and/or efficiency of the device may be achieved.

In this regard, may be selected from Mg, Mn and Zn, and x may be 2. In this way, further advantages with respect to operational voltage and/or efficiency of the device may be achieved.

In this regard, it may be provided that the compound of formula (I), i.e. the partially or fully halogenated metal complex may be selected from compounds (II) and (III)

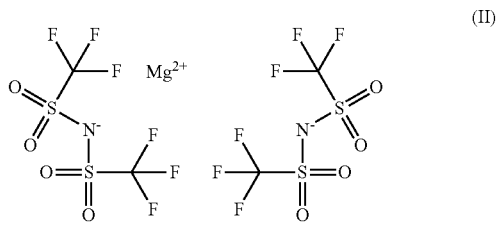

(II)

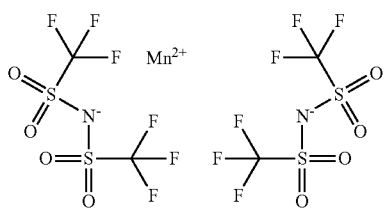

(III)

In this way, further advantages with respect to operational voltage and/or efficiency of the device may be achieved.

Further examples of partially or fully halogenated metal complexes suitable for the present invention may be found in recently published applications WO 2018/150048 A1, WO 2018/150049 A1, WO 2018/150050 A1 and WO 2018/150051 A1.

The light emitting layer in the organic light emitting device according to the invention may comprise a phosphorescent emitter, alternatively a green phosphorescent emitter.

The organic light emitting device may further comprise at least one further layer selected from the group consisting of an electron transport layer, a hole blocking layer and an electron injection layer.

The anode of the organic light emitting device according to the present invention may be a transparent conductive oxide (TCO) anode.

In this regard, the transparent conductive oxide may be indium tin oxide (ITO), indium zinc oxide (IZO), aluminum zinc oxide (AlZO) or a mixture of two or more thereof.

The cathode of the organic light emitting device according to the present invention may be a reflective cathode and/or a semitransparent cathode.

In this regard, the cathode may comprise an elemental metal. The elemental metal which may be comprised in the cathode of the organic light emitting device of the present invention may be selected from the group consisting of aluminum (Al), silver (Ag), magnesium (Mg) and a mixture of two or more thereof.

In the organic light emitting device according to the present invention, the electron transport layer and/or the electron injection layer may comprise a n-dopant.

The n-dopant which may be comprised in the electron transport layer and/or the electron injection layer of the organic light emitting device according to the present invention may be selected from the group consisting of metal salts, metal complexes, elemental metal and reductive organic radicals. Exemplary suitable compounds are disclosed below.

Further Layers

The organic light emitting device according to the invention comprises a variety of different layers stacked together to form the essential functional part of the organic light emitting device. Further details as to the respective layers and regions of the organic light emitting device according to the present invention are provided in the following.

Electron Transport Region

An electron transport region of the stack of organic layers forming the organic light emitting device may be disposed on the emission layer.

The electron transport region of the stack of organic layers includes at least the first electron transport layer and optional a second electron transport layer. The electron transport region of the stack of organic layers may further include an electron injection layer.

For example, the electron transport region of the stack of organic layers may have a structure of the first electron transport layer/electron injection or as an alternative a first electron transport layer/second electron transport layer/electron injection layer but is not limited thereto. For example, an organic light emitting diode according to an embodiment of the present invention includes at least one electron transport layer, and in this case, the electron transport layer comprising the electrical p-dopant and the at least one first electron transport matrix compound is defined as the first electron transport layer. In another embodiment, the organic light emitting diode may comprise at least two electron transport layers in the electron transport region of the stack of organic layers, and in this case, the electron transport layer contacting the emission layer is defined as the second electron transport layer.

The electron transport layer may include one or two or more different electron transport matrix compounds.

The thickness of the first electron transport layer may be from about 2 nm to about 100 nm, for example about 3 nm to about 30 nm. When the thickness of the first electron transport layer is within these ranges, the first electron transport layer may have improved electron transport auxiliary ability without a substantial increase in driving voltage.

A thickness of the optional second electron transport layer may be about 10 nm to about 100 nm, for example about 15 nm to about 50 nm. When the thickness of the electron transport layer is within these ranges, the electron transport layer may have satisfactory electron transporting ability without a substantial increase in driving voltage.

First Electron Transport Matrix Compound

First electron transport matrix is not particularly limited. Similarly as other materials which are in the inventive device comprised outside the emitting layer, the second electron transport matrix may not emit light.

According to one embodiment, the first electron transport matrix can be an organic compound, an organometallic compound, or a metal complex.

According to one embodiment, the first electron transport matrix may be a covalent compound comprising a conjugated system of at least 6 delocalized electrons. Under a covalent material in a broadest possible sense, it might be understood a material, wherein at least 50% of all chemical bonds are covalent bonds, wherein coordination bonds are also considered as covalent bonds. In the present application, the term encompasses in the broadest sense all usual electron transport matrices which are predominantly selected from organic compounds but also e.g. from compounds comprising structural moieties which do not comprise carbon, for example substituted 2,4,6-tribora-1,3,5 triazines, or from metal complexes, for example aluminium tris(8-hydroxyquinolinolate).

The molecular covalent materials can comprise low molecular weight compounds which may be, preferably, stable enough to be processable by vacuum thermal evaporation (VTE). Alternatively, covalent materials can comprise polymeric covalent compounds, preferably, compounds soluble in a solvent and thus processable in form of a solution. It is to be understood that a polymeric substantially covalent material may be crosslinked to form an infinite irregular network, however, it is supposed that such crosslinked polymeric substantially covalent matrix compound still comprises both skeletal as well as peripheral atoms. Skeletal atoms of the covalent compound are covalently bound to at least two neighbour atoms. Other atoms of the covalent compound are peripheral atoms which are covalently bound with a single neighbour atom. Inorganic infinite crystals or fully crosslinked networks having partly covalent bonding but substantially lacking peripheral atoms, like silicon, germanium, gallium arsenide, indium phosphide, zinc sulfide, silicate glass etc are not considered as covalent matrices in the sense of present application, because such fully crosslinked covalent materials comprise peripheral atoms only on the surface of the phase formed by such material. A compound comprising cations and anions is still considered as covalent, if at least the cation or at least the anion comprises at least ten covalently bound atoms.

Preferred examples of covalent first electron transport matrix compounds are organic compounds, consisting predominantly from covalently bound C, H, O, N, S, which may optionally comprise also covalently bound B, P, As, Se. In one embodiment, the first electron transport matrix compound lacks metal atoms and majority of its skeletal atoms is selected from C, O, S, N.

In another embodiment, the first electron transport matrix compound comprises a conjugated system of at least six, more preferably at least ten, even more preferably at least fourteen delocalized electrons.

Examples of conjugated systems of delocalized electrons are systems of alternating pi- and sigma bonds. Optionally, one or more two-atom structural units having the pi-bond between its atoms can be replaced by an atom bearing at least one lone electron pair, typically by a divalent atom selected from O, S, Se, Te or by a trivalent atom selected from N, P, As, Sb, Bi. Preferably, the conjugated system of delocalized electrons comprises at least one aromatic or heteroaromatic ring adhering to the Hückel rule. Also preferably, the first electron transport matrix compound may comprise at least two aromatic or heteroaromatic rings which are either linked by a covalent bond or condensed.

In one of specific embodiments, the first electron transport matrix compound comprises a ring consisting of covalently bound atoms and at least one atom in the ring is phosphorus.

In a more preferred embodiment, the phosphorus-containing ring consisting of covalently bound atoms is a phosphepine ring.

In another preferred embodiment, the first electron transport compound comprises a phosphine oxide group. Also preferably, the s first electron transport matrix compound comprises a heterocyclic ring comprising at least one nitrogen atom. Examples of nitrogen containing heterocyclic compounds which are particularly advantageous as first electron transport matrix compound for the inventive device are matrices comprising, alone or in combination, pyridine structural moieties, diazine structural moieties, triazine structural moieties, quinoline structural moieties, benzoquinoline structural moieties, quinazoline structural moieties, acridine structural moieties, benzacridine structural moieties, dibenzacridine structural moieties, diazole structural moieties and benzodiazole structural moieties.

The first electron transport matrix compound may have a molecular weight (Mw) of ≥400 to ≤850 g/mol, preferably ≥450 to ≤830 g/mol. If the molecular weight is selected in this range, particularly reproducible evaporation and deposition can be achieved in vacuum at temperatures where good long-term stability is observed.

Preferably, the first electron transport matrix compound may be essentially non-emissive.

In another embodiment, the first electron transport matrix compound may have dipole moment, computed using the hybrid functional B3LYP with a Gaussian 6-31G* basis set as implemented in the program package TURBOMOLE V6.5 for the lowest energy conformer found by the program package TURBOMOI V6.5 using the hybrid functional B3LYP with a Gaussian 6-31G* basis set, higher than 2.3 Debye. It may be a preferred embodiment in combination with redox dopants selected from elemental metals.

According to a further aspect of the invention, the reduction potential of the first electron transport matrix compound, if measured under the same conditions by cyclic voltammetry against Fc/Fc+ in tetrahydrofuran, may have a value which is less negative than the value obtained for triphenylphosphine oxide and more negative than the value obtained for tetrakis(quinoxalin-5-yloxy)zirconium.

Under these conditions the redox potential of triphenylphosphine oxide is about −3.06 V and the reduction potential of tetrakis(quinoxalin-5-yloxy)zirconium is about −1.78 V.

According to a further aspect of the invention, the redox potential of the first electron transport matrix compound, if measured under the same conditions by cyclic voltammetry against Fc/Fc+ in tetrahydrofuran, may have a value which is less negative than the respective value obtained for triphenylphosphine oxide, preferably less negative than the respective value for bis(4-(9H-carbazol-9-yl)phenyl)-(phenyl)phosphine oxide, more preferably less negative than the respective value for 3-([1,1-biphenyl]-4-yl)-5-(4-(tert-butyl)phenyl)-4-phenyl-4H-1,2,4-triazole, even more preferably less negative than the respective value for pyrene, most preferably less negative than the respective value for 2,7-di-pyrenyl-9,9-spirobifluorene, also preferably less negative than the respective value for 4,7-diphenyl-1,10-phenanthroline, also preferably less negative than the respective value for 2,4,7,9-tetraphenyl-1,10-phenanthroline, also preferably less negative than the respective value for 7-([1,1'-biphenyl]-4-yl)dibenzo[c,h]acridine, also preferably less negative than the respective value for 2,4,6-triphenyltriazine, and still preferably less negative than the respective value for 2,4,6-tri(biphenyl-4-yl)-1,3,5-triazine.

According to a further aspect of the invention, the redox potential of the first electron transport matrix compound, if measured under the same conditions by cyclic voltammetry against Fc/Fc+ in tetrahydrofuran, may have the value which is more negative than the respective value obtained for tetrakis(quinoxalin-5-yloxy)zirconium, preferably more negative than the respective value for 4,4'-bis(4,6-diphenyl-1,3,5-triazin-2-yl)-1,1'-biphenyl, most preferably more negative than the respective value for 2,4,6-tri(biphenyl-4-yl)-1,3,5-triazine.

The redox potential can be determined by following standard method, using cyclic voltammetry with potentiostatic device Metrohm PGSTAT30 and software Metrohm Autolab GPES at room temperature. The redox potentials given at particular compounds are measured in an argon de-aerated, dry 0.1M THF solution of the tested substance, under argon atmosphere, with 0.1M tetrabutylammonium hexafluorophosphate supporting electrolyte, between platinum working electrodes and with an Ag/AgCl pseudo-standard electrode (Metrohm Silver rod electrode), consisting of a silver wire covered by silver chloride and immersed directly in the measured solution, with the scan rate 100 mV/s. The first run is done in the broadest range of the potential set on the working electrodes, and the range was then adjusted within subsequent runs appropriately. The final three runs are done with the addition of ferrocene (in 0.1M concentration) as the standard. The average of potentials corresponding to cathodic and anodic peak of the studied compound, after subtraction of the average of cathodic and anodic potentials observed for the standard Fc+/Fc redox couple, afford finally the values reported above. All studied compounds as well as the reported comparative compounds showed well-defined reversible electrochemical behaviour.

Examples of electron transport layers and suitable electron transport matrix compounds can be found e.g. in recently published application WO 2018/138373 A1.

According to various embodiments of the electroluminescent device, wherein the first electron transport layer comprises about ≤100 wt.-% to about ≥30 wt.-%, preferably ≤95 wt.-% to about ≥40 wt.-%, of a matrix compound, based on the total weight of the first electron transport layer.

Preferably, the first electron transport matrix compound may be essentially non-emissive.

Second Electron Transport Matrix

Second electron transport compound is not particularly limited. Similarly as other materials which are in the inventive device comprised outside the emitting layer, the second electron transport matrix may not emit light.

According to one embodiment, the second electron transport matrix compound can be an organic compound, an organometallic compound, or a metal complex.

Compounds listed as examples of the first electron transport matrix compound can be used also as the second electron transport matrix compound.

According to one embodiment, the device comprises in addition a second electron transport layer comprising at least one second electron transport matrix compound which is selected from covalent compounds comprising a conjugated system of at least 6 delocalized electrons, preferably from organic compounds comprising at least one aromatic ring, more preferably from organic compounds comprising at least two aromatic rings, even more preferably from organic compounds comprising at least three aromatic rings, most preferably from organic compounds comprising at least four aromatic rings; and the second electron transport layer is arranged between the first electron transport layer and the light emitting layer, preferably the second hole transport layer is formed of the second electron transport matrix compound, and further preferably the second electron transport layer is adjacent arranged to the first electron transport layer and/or to the light emitting layer.

According to one embodiment, the second electron transport matrix compound may be a covalent compound comprising a conjugated system of at least 6 delocalized electrons.

In one embodiment, the dipole moment of the second electron transport matrix compound is selected a ≥0.5 Debye and ≤4.5 Debye, preferably a ≥1.0 Debye and <4.0 Debye, more preferably a ≥1.5 Debye and <3.5 Debye.

According to a further aspect of the invention, the redox potential of the second electron matrix compound may be selected less negative than −2.35 V and more negative than −2.14 V, preferably less negative than −2.3 V and more negative than −2.16 V, more preferably less negative than −2.25 V and more negative than −2.16 V, when measured against Fc/Fc+ in tetrahydrofuran.

Redox n-Dopant

Under redox n-dopant, it is understood a compound which, if embedded into an electron transport matrix, increases concentration of free electrons in comparison with the neat matrix under the same physical conditions measured by cyclic voltammetry against ferrocene/ferrocenium reference redox couple.

The redox n-dopant may not emit light under the operation condition of an electroluminescent device, for example an OLED. In one embodiment, the redox n-dopant is selected from an elemental metal, an electrically neutral metal complex and/or an electrically neutral organic radical.

The most practical benchmark for the strength of an n-dopant is the value of its redox potential. There is no particular limitation in terms how negative the value of the redox potential can be.

As redox potentials of usual electron transport matrices used in organic light emitting diodes are, if measured by cyclic voltammetry against ferrocene/ferrocenium reference redox couple, roughly in the range from about −1.8 V to about −3.1V; the practically applicable range of redox potentials for n-dopants which can effectively n-dope such matrices is in a slightly broader range, from about −1.7 V to about −3.3 V.

The measurement of redox potentials is practically performed for a corresponding redox couple consisting of the reduced and of the oxidized form of the same compound.

In case that the redox n-dopant is an electrically neutral metal complex and/or an electrically neutral organic radical, the measurement of its redox potential is actually performed for the redox couple formed by (i) the electrically neutral metal complex and its cation radical formed by an abstraction of one electron from the electrically neutral metal complex, or (ii) the electrically neutral organic radical and its cation formed by an abstraction of one electron from the electrically neutral organic radical.

Preferably, the redox potential of the electrically neutral metal complex and/or of the electrically neutral organic radical may have a value which is more negative than −1.7 V, preferably more negative than −1.9 V, more preferably more negative than −2.1 V, even more preferably more negative than −2.3 V, most preferably more negative than −2.5 V, if measured by cyclic voltammetry against ferrocene/ferrocenium reference redox couple for a corresponding redox couple consisting of (i) the electrically neutral metal complex and its cation radical formed by an abstraction of one electron from the electrically neutral metal complex, or (ii) the electrically neutral organic radical and its cation formed by an abstraction of one electron from the electrically neutral organic radical.

In a preferred embodiment, the redox potential of the n-dopant is between the value which is about 0.5 V more positive and the value which is about 0.5 V more negative than the value of the reduction potential of the chosen electron transport matrix.

Electrically neutral metal complexes suitable as redox n-dopants may be e.g. strongly reductive complexes of some transition metals in low oxidation state. Particularly strong redox n-dopants may be selected for example from Cr(II), Mo(II) and/or W(II) guanidinate complexes such as W2(hpp)4, as described in more detail in WO2005/086251.

Electrically neutral organic radicals suitable as redox n-dopants may be e.g. organic radicals created by supply of additional energy from their stable dimers, oligomers or polymers, as described in more detail in EP 1 837 926 B1, WO2007/107306, or WO2007/107356. Specific examples of such suitable radicals may be diazolyl radicals, oxazolyl radicals and/or thiazolyl radicals.

Under an elemental metal, it is understood a metal in a state of a neat metal, of a metal alloy, or in a state of free atoms or metal clusters. It is understood that metals deposited by vacuum thermal evaporation from a metallic phase, e.g. from a neat bulk metal, vaporize in their elemental form. It is further understood that if the vaporized elemental metal is deposited together with a covalent matrix, the metal atoms and/or clusters are embedded in the covalent matrix. In other words, it is understood that any metal doped covalent material prepared by vacuum thermal evaporation contains the metal at least partially in its elemental form.

For the use in consumer electronics, only metals containing stable nuclides or nuclides having very long halftime of radioactive decay might be applicable. As an acceptable level of nuclear stability, the nuclear stability of natural potassium can be taken.

In one embodiment, the n-dopant is selected from electropositive metals selected from alkali metals, alkaline earth metals, rare earth metals and metals of the first transition period Ti, V, Cr and Mn. Preferably, the n-dopant is selected from Li, Na, K, Rb, Cs, Mg, Ca, Sr, Ba, Sm, Eu, Tm, Yb; more preferably from Li, Na, K, Rb, Cs, Mg and Yb, even more preferably from Li, Na, Cs and Yb, most preferably from Li, Na and Yb.

The redox dopant may be essentially non-emissive.

Hole Injection Layer

The inventive organic light emitting device may comprise one or more hole injection layers. In case that the hole injection layer is arranged between the first hole transport layer and the light emitting layer, this hole transport layer is the "second hole injection layer" in terms of the present invention and comprises the second hole injection compound, i.e. a halogenated fullerene, a partially or fully halogenated metal complex or a mixture thereof, as defined herein.

The inventive organic light emitting device may comprise one or more further hole injection layers in addition to the second hole injection layer, for example a first hole injection layer as defined herein which is adjacent to the anode. Unless mentioned else (in particular with respect to the second hole injection layer) the hole injection layer may have the below properties and may comprise the below materials for forming the same.

The hole injection layer may improve interface properties between the anode and an organic material used for the hole transport layer, and is applied on a non-planarized anode and thus planarizes the surface of the anode. For example, the hole injection layer may include a material having a median value of the energy level of its highest occupied molecular orbital (HOMO) between the work function of the anode material and the energy level of the HOMO of the hole transport layer, in order to adjust a difference between the work function of the anode and the energy level of the HOMO of the hole transport layer.

When the hole transport region includes a hole injection layer 36, the hole injection layer may be formed on the anode by any of a variety of methods, for example, vacuum deposition, spin coating, casting, Langmuir-Blodgett (LB) method, or the like.

When hole injection layer is formed using vacuum deposition, vacuum deposition conditions may vary depending on the material that is used to form the hole injection layer, and the desired structure and thermal properties of the hole injection layer to be formed and for example, vacuum deposition may be performed at a temperature of about 100° C. to about 500° C., a pressure of about 10-6 Pa to about 10-1 Pa, and a deposition rate of about 0.1 to about 10 nm/sec, but the deposition conditions are not limited thereto.

When the hole injection layer is formed using spin coating, the coating conditions may vary depending on the material that is used to form the hole injection layer, and the desired structure and thermal properties of the hole injection layer to be formed. For example, the coating rate may be in the range of about 2000 rpm to about 5000 rpm, and a temperature at which heat treatment is performed to remove a solvent after coating may be in a range of about 80° C. to about 200° C., but the coating conditions are not limited thereto.

Examples of hole transport matrix materials suitable for the present invention may be found e.g. in WO 2013/135237 A1, WO 2014/060526 A1 or WO 2015/158886 A1 and in documents cited therein, or in recently published applications WO2018/150006 A1, WO 2018/150048 A1, WO 2018/150049 A1, WO 2018/150050 A1 and WO 2018/150051 A1.

Hole Transport Layer

Conditions for forming the hole transport layer and the electron blocking layer may be defined based on the above-described formation conditions for the hole injection layer.

A thickness of the hole transport part of the charge transport region may be from about 10 nm to about 1000 nm, for example, about 10 nm to about 100 nm. When the hole transport part of the charge transport region includes the hole injection layer and the hole transport layer, a thickness of the hole injection layer may be from about 10 nm to about 1000 nm, for example about to nm to about 100 nm and a thickness of the hole transport layer may be from about 5 nm to about 200 nm, for example about 10 nm to about 150 nm. When the thicknesses of the hole transport part of the charge transport region, the HIL, and the HTL are within these ranges, satisfactory hole transport characteristics may be obtained without a substantial increase in driving voltage.

Hole transport matrix materials used in the hole transport region are not particularly limited. Preferred are covalent compounds comprising a conjugated system of at least 6 delocalized electrons, preferably organic compounds comprising at least one aromatic ring, more preferably organic compounds comprising at least two aromatic rings, even more preferably organic compounds comprising at least three aromatic rings, most preferably organic compounds comprising at least four aromatic rings. Typical examples of hole transport matrix materials which are widely used in hole transport layers are polycyclic aromatic hydrocarbons, triaryl amine compounds and heterocyclic aromatic compounds. Suitable ranges of frontier orbital energy levels of hole transport matrices useful in various layer of the hole transport region are well-known. In terms of the redox potential of the redox couple HTL matrix/cation radical of the HTL the preferred values (if measured by cyclic voltammetry against ferrocene/ferrocenium redox couple as reference) may be in the range 0.0-1.0 V, more preferably in the range 0.2-0.7 V, even more preferably in the range 0.3-0.5 V.

Examples of hole transport matrix materials suitable for the present invention may be found e.g. in WO 2013/135237 A1, WO 2014/060526 A1 or WO 2015/158886 A1 and in documents cited therein, or in recently published applications WO 2018/150006 A1, WO 2018/150048 A1, WO 2018/150049 A1, WO 2018/150050 A1 and WO 2018/150051 A1.

The hole transport region of the stack of organic layers shall further include an electrical p-dopant improving conductivity and/or hole injection from the anode, in addition to the materials as described above.

Electrical p-Dopant

The charge-generating material may be homogeneously or inhomogeneously dispersed in the first hole transport layer.

The electrical p-dopant may be one of a quinone derivative, a radialene compound, a metal oxide, and a cyano group-containing compound, but is not limited thereto. Non-limiting examples of the p-dopant are quinone derivatives such as tetracyanoquinonedimethane (TCNQ), 2,3,5,6-tetrafluoro-tetracyano-1,4-benzoquinonedimethane (F4-

TCNQ), radialene compounds like PD-2 and the like; metal oxides such as tungsten oxide, molybdenum oxide, and the like; and cyano-containing compounds such as compound HT-D1 below.

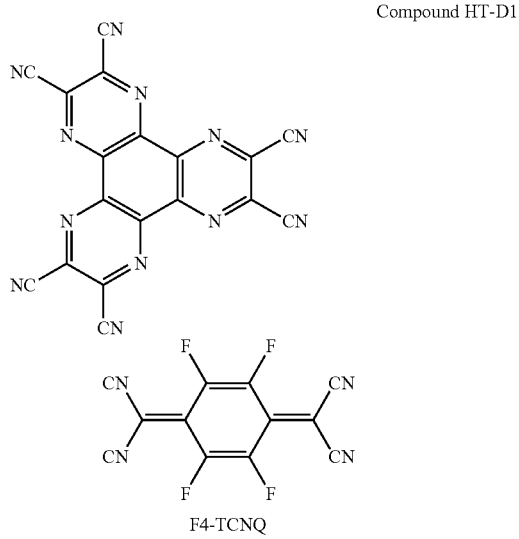

F4-TCNQ

Buffer Layer

The hole transport part of the charge transport region may further include a buffer layer.

Buffer layer that can be suitable used are disclosed in U.S. Pat. Nos. 6,140,763, 6,614,176 and in US2016/248022.

The buffer layer may compensate for an optical resonance distance of light according to a wavelength of the light emitted from the EML, and thus may increase efficiency.

Emission Layer

The emission layer (EML) may be formed on the hole transport region by using vacuum deposition, spin coating, casting, LB method, or the like. When the emission layer is formed using vacuum deposition or spin coating, the conditions for deposition and coating may be similar to those for the formation of the hole injection layer, though the conditions for the deposition and coating may vary depending on the material that is used to form the emission layer. The emission layer may include an emitter host (EML host) and an emitter dopant (further only emitter).

The emitter may be a red, green, or blue emitter.

In one embodiment, the emitter host material is a polar emitter host compound. Preferably the emitter host material can be a polar emitter host compound, which has a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.2 Debye to about ≤2.0 Debye.

In one embodiment, the emitter host material is a polar emitter host compound having at least three aromatic rings, which are independently selected from carbocyclic rings and heterocyclic rings.

In one preferred embodiment, the emitter host material can be a polar emitter host compound having at least three aromatic rings, which are independently selected from carbocyclic rings and heterocyclic rings, which has a has a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.2 Debye to about ≤2.0 Debye.

In one embodiment, the emitter host material is a polar emitter host compound represented by the chemical Formula 1:

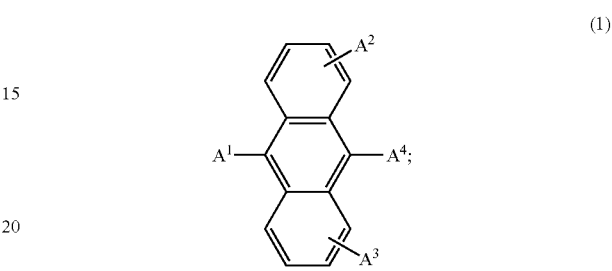

wherein
A1 is selected from the group comprising a substituted or unsubstituted C6-C60 aryl or C6-C60 heteroaryl;
A2 is selected from the group comprising a substituted or unsubstituted C1 to C10 alkyl group, a substituted or unsubstituted C6-C60 aryl or C6-C60 heteroaryl;
A3 is selected from the group comprising a substituted or unsubstituted C1 to C10 alkyl group, a substituted or unsubstituted C6-C60 aryl or C6-C60 heteroaryl;
A4 is selected from the group comprising a substituted or unsubstituted C6-C60 aryl or C6-C60 heteroaryl, preferably a C6-C60 heteroaryl.

Emitter Host

The polar emitter host compound has at least three aromatic rings, which are independently selected from carbocyclic rings and heterocyclic rings.

The polar emitter host compound may have a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.2 Debye to about ≤2.0 Debye.

According to one embodiment of electroluminescent device the polar emitter host compound has at least three aromatic rings, which are independently selected from carbocyclic rings and heterocyclic rings, and may have a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.2 Debye to about ≤2.0 Debye.

In another embodiment, the emitter host compound may have a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≤0.3 Debye to about ≥1.8 Debye, preferably in the range from about ≤0.5 Debye to about ≥1.6 Debye, even more preferred in the range from about ≤0.6 Debye to about ≤1.4 Debye, and most preferred in the range from about ≥0.7 Debye to about ≤1.3 Debye.

The dipole moment $|\vec{\mu}|$ of a molecule containing N atoms is given by:

$$\vec{\mu} = \sum_i^N q_i \vec{r}_i$$

$$|\vec{\mu}| = \sqrt{\mu_x^2 + \mu_y^2 + \mu_z^2}$$

where $q_i$ and $d\vec{r}_i$ are the partial charge and position of atom i in the molecule.

The partial charges and atomic positions are computed for the lowest energy conformation of the ground state a molecule in a gas phase, by a standardized method, using the hybrid functional B3LYP with a Gaussian 6-31G* basis set as implemented in the program package TURBOMOLE V6.5. If more than one conformation is viable, the energy of the possible conformations is computed using the hybrid functional B3LYP with a Gaussian 6-31G* basis set as implemented in the program package TURBOMOLE V6.5 first, and the conformation with the lowest total energy is selected to determine the dipole moment.

The dipole moments and redox potentials of compounds which may be suitable as the second electron transport matrix compound can be found in recently published application WO 2018/138373 A1. According to a further aspect of the invention, the emitter host respectively has a redox potential which, if measured under the same conditions by cyclic voltammetry against Fc/Fc+ in tetrahydrofuran, has a value more negative than the respective value obtained for 7-([1,1'-biphenyl]-4-yl)dibenzo[c,h]acridine, preferably more negative than the respective value for 9,9',10,10'-tetraphenyl-2,2'-bianthracene, more preferably more negative than the respective value for 2,9-di([1,1'-biphenyl]-4-yl)-4,7-diphenyl-1,10-phenanthroline, even more preferably more negative than the respective value for 2,4,7,9-tetraphenyl-1,10-phenanthroline, even more preferably more negative than the respective value for 9,10-di(naphthalen-2-yl)-2-phenylanthracene, even more preferably more negative than the respective value for 2,9-bis(2-methoxyphenyl)-4,7-diphenyl-1,10-phenanthroline, most preferably more negative than the respective value for 9,9'-spirobi[fluorene]-2,7-diylbis(diphenylphosphine oxide).

The emitter is mixed in a small amount to cause light emission. The emitter may be, for example an inorganic, organic, or organometallic compound, and one or more kinds thereof may be used.

The emitter may be a fluorescent emitter; for example ter-fluorene, 4.4'-bis(4-diphenyl aminostyryl)biphenyl (DPAVBi), 2,5,8,11-tetra-tert-butyl perylene (TBPe), and Compound 4 below are examples of fluorescent blue emitters.

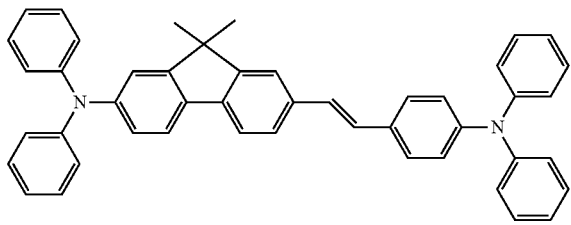 [SMILES: CC1(C)c2cc(/C=C/c3ccc(N(c4ccccc4)c4ccccc4)cc3)ccc2-c2ccc(N(c3ccccc3)c3ccccc3)cc21]

Compound 4

A thickness of the emission layer may be about 10 nm to about 100 nm, for example about 20 nm to about 60 nm. When the thickness of the emission layer is within these ranges, the emission layer may have improved emission characteristics without a substantial increase in a driving voltage.

Electron Injection Layer

According to another aspect of the invention, the organic electroluminescent device may further comprise an electron injection layer between the first electron transport layer and the cathode.

The electron injection layer (EIL) may facilitate injection of electrons from the cathode.

According to another aspect of the invention, the electron injection layer comprises:
(i) an electropositive metal selected from alkali metals, alkaline earth metals and rare earth metals in substantially elemental form, preferably selected from Li, Na, K, Rb, Cs, Mg, Ca, Sr, Ba, Eu and Yb, more preferably from Li, Na, Mg, Ca, Sr and Yb, even more preferably from Li and Yb, most preferably Yb; and/or
(ii) an alkali metal complex and/or alkali metal salt, preferably the Li complex and/or salt, more preferably a Li quinolinolate, even more preferably a lithium 8-hydroxyquinolinolate, most preferably the alkali metal salt and/or complex of the second electron transport layer is identical with the alkali metal salt and/or complex of the injection layer.

The electron injection layer may include at least one selected from LiF, NaCl, CsF, Li2O, and BaO.

A thickness of the EIL may be from about 0.1 nm to about 10 nm, or about 0.3 nm to about 9 nm. When the thickness of the electron injection layer is within these ranges, the electron injection layer may have satisfactory electron injection ability without a substantial increase in driving voltage.

Cathode

A material for the cathode may be a metal, an alloy, or an electrically conductive compound that have a low work function, or a combination thereof. Specific examples of the material for the cathode may be lithium (Li), magnesium (Mg), aluminum (Al), aluminum-lithium (Al—Li), calcium (Ca), magnesium-indium (Mg—In), magnesium-silver (Mg—Ag), etc. In order to manufacture a top-emission light-emitting device having a reflective anode deposited on a substrate, the cathode may be formed as a transmissive electrode from, for example, indium tin oxide (ITO) or indium zinc oxide (IZO).

In devices comprising a transparent metal oxide cathode or a reflective metal cathode, the cathode may have a thickness from about 50 nm to about 100 nm, whereas semitransparent metal cathodes may be as thin as from about 5 nm to about 15 nm.

Anode

A material for the anode may be a metal or a metal oxide, or an organic material, preferably a material with work function above about 4.8 eV, more preferably above about 5.1 eV, most preferably above about 5.3 eV. Preferred metals are noble metals like Pt, Au or Ag, preferred metal oxides are transparent metal oxides like ITO or IZO which may be advantageously used in bottom-emitting OLEDs having a reflective cathode.

In devices comprising a transparent metal oxide anode or a reflective metal anode, the anode may have a thickness from about 50 nm to about 100 nm, whereas semitransparent metal anodes may be as thin as from about 5 nm to about 15 nm.

Organic Light-Emitting Diode (OLED)

According to one aspect of the present invention, there is provided an organic light-emitting diode (OLED) comprising: a substrate; an anode electrode formed on the substrate; optionally a first hole injection layer, a hole transport layer, a second hole injection layer, an emission layer, and a cathode electrode.

According to another aspect of the present invention, there is provided an OLED comprising: a substrate; an anode electrode formed on the substrate; optionally a first hole injection layer, a hole transport layer, a second hole injection layer, an electron blocking layer, an emission layer, a hole blocking layer and a cathode electrode.

According to another aspect of the present invention, there is provided an OLED comprising: a substrate; an anode electrode formed on the substrate; optionally a first hole injection layer, a hole transport layer, a second hole injection layer, an electron blocking layer, an emission layer, a hole blocking layer, an electron transport layer, and a cathode electrode.

According to another aspect of the present invention, there is provided an OLED comprising: a substrate; an anode electrode formed on the substrate; optionally a first hole injection layer, a hole transport layer, a second hole injection layer, an electron blocking layer, an emission layer, a hole blocking layer, an electron transport layer, an electron injection layer, and a cathode electrode.

According to various embodiments of the present invention, there may be provided OLEDs comprising layers arranged between the above mentioned layers, on the substrate or on the top electrode.

According to one aspect, the OLED can comprise a layer structure of a substrate that is adjacent arranged to an anode electrode, the anode electrode is adjacent arranged to a (optional) first hole injection layer, the first hole injection layer is adjacent arranged to a first hole transport layer, the first hole transport layer is adjacent arranged to a second hole injection layer, the second hole injection layer is adjacent arranged to a first electron blocking layer, the first electron blocking layer is adjacent arranged to a first emission layer, the first emission layer is adjacent arranged to a first electron transport layer, the first electron transport layer is adjacent arranged to an n-type charge generation layer, the n-type charge generation layer is adjacent arranged to a hole generating layer, the hole generating layer is adjacent arranged to a second hole transport layer, the second hole transport layer is adjacent arranged to a second electron blocking layer, the second electron blocking layer is adjacent arranged to a second emission layer, between the second emission layer and the cathode electrode an optional electron transport layer and/or an optional a third injection layer are arranged.

For example, the OLED (100) according to FIG. 2 may be formed by a process, wherein an anode (110), a first hole injection layer (120), a hole transport layer (130), a second hole injection layer (140), an electron blocking layer (145), an emission layer (150), a hole blocking layer (155), an electron transport layer (160), an electron injection layer (180) and the cathode electrode (190) are subsequently formed in that order on a substrate (not shown).

Details and Definitions of the Invention

In the inventive organic light emitting device, the second hole injection layer comprises a second hole injection compound. In this regard, it may be provided that the second hole injection layer consists of the second hole injection compound. Likewise, it may be provided that the second hole injection compound is embedded in a matrix material, i.e. the matrix material is the predominant material in such a layer.

The term "hydrocarbyl group" as used herein shall be understood to encompass any organic group comprising carbon atoms, in particular organic groups, such as alkyl, aryl, heteroaryl, heteroalkyl, in particular such groups which are substituents usual in organic electronics.

The term "alkyl" as used herein shall encompass linear as well as branched and cyclic alkyl. For example, $C_3$-alkyl may be selected from n-propyl and iso-propyl. Likewise, $C_4$-alkyl encompasses n-butyl, sec-butyl and t-butyl. Likewise, $C_6$-alkyl encompasses n-hexyl and cyclo-hexyl.

The subscribed number n in $C_n$ relates to the total number of carbon atoms in the respective alkyl, arylene, heteroarylene or aryl group.

The term "aryl" as used herein shall encompass phenyl ($C_6$-aryl), fused aromatics, such as naphthalene, anthracene, phenanthrene, tetracene etc. Further encompassed are biphenyl and oligo- or polyphenyls, such as terphenyl etc. Further encompassed shall be any further aromatic hydrocarbon substituents, such as fluorenyl etc. Arylene, respectively heteroarylene refers to groups to which two further moieties are attached.

The term "heteroaryl" as used herein refers to aryl groups in which at least one carbon atom is substituted by a heteroatom, preferably selected from N, O, S, B or Si.

The term "halogenated" refers to an organic compound in which one hydrogen atom thereof is replaced by a halogen atom. The term "perhalogenated" refers to an organic compound in which all of the hydrogen atoms thereof are replaced by halogen atoms. The meaning of the terms "fluorinated" and "perfluorinated" should be understood analogously.

The subscripted number n in $C_n$-heteroaryl merely refers to the number of carbon atoms excluding the number of heteroatoms. In this context, it is clear that a $C_3$ heteroarylene group is an aromatic compound comprising three carbon atoms, such as pyrazol, imidazole, oxazole, thiazole and the like.

In terms of the invention, the expression "between" with respect to one layer being between two other layers does not exclude the presence of further layers which may be arranged between the one layer and one of the two other layers. In terms of the invention, the expression "in direct contact" with respect to two layers being in direct contact with each other means that no further layer is arranged between those two layers. One layer deposited on the top of another layer is deemed to be in direct contact with this layer.

In the context of the present specification the term "essentially non-emissive" or "non-emissive" means that the contribution of the compound or layer to the visible emission spectrum from the device is less than 10%, preferably less than 5% relative to the visible emission spectrum. The visible emission spectrum is an emission spectrum with a wavelength of about a ≥380 nm to about ≤780 nm.

Preferably, the layer comprising the second hole injection compound is essentially non-emissive or non-emitting.

With respect to the inventive organic light emitting device, the compounds mentioned in the experimental part may be most preferred.

According to another aspect, the organic electroluminescent device according to the present invention may comprise more than one emission layer, preferably two or three emission layers. An OLED comprising more than one emission layer is also described as a tandem OLED or stacked OLED.

The organic electroluminescent device (OLED) may be a bottom- or top-emission device.

Another aspect is directed to a device comprising at least one organic electroluminescent device (OLED). A device comprising organic light-emitting diodes is for example a display or a lighting panel.

In the present invention, the following defined terms, these definitions shall be applied, unless a different definition is given in the claims or elsewhere in this specification.

In the context of the present specification the term "different" or "differs" in connection with the matrix material means that the matrix material differs in their structural formula.

The energy levels of the highest occupied molecular orbital, also named HOMO, and of the lowest unoccupied molecular orbital, also named LUMO, are measured in electron volt (eV).

The terms "OLED" and "organic light-emitting diode" are simultaneously used and have the same meaning. The term "organic electroluminescent device" as used herein may comprise both organic light emitting diodes as well as organic light emitting transistors (OLETs).

As used herein, "weight percent", "wt.-%", wt %, "percent by weight", "% by weight", and variations thereof refer to a composition, component, substance or agent as the weight of that component, substance or agent of the respective electron transport layer divided by the total weight of the respective electron transport layer thereof and multiplied by 100. It is understood that the total weight percent amount of all components, substances and agents of the respective electron transport layer and electron injection layer are selected such that it does not exceed 100 wt.-%.

As used herein, "volume percent", "vol.-%", "percent by volume", "% by volume", and variations thereof refer to a composition, component, substance or agent as the volume of that component, substance or agent of the respective electron transport layer divided by the total volume of the respective electron transport layer thereof and multiplied by 100. It is understood that the total volume percent amount of all components, substances and agents of the cathode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities. Impurities have no technical effect with respect to the object achieved by the present invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

EMBODIMENTS OF THE INVENTIVE DEVICE

Figure 1:
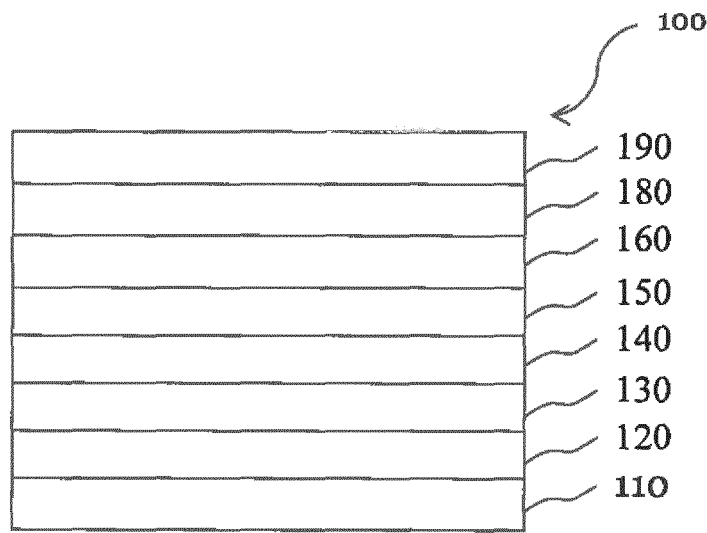
FIG. 1 is a schematic sectional view of an organic light-emitting diode (MED), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

FIG. 1 is a schematic sectional view of an organic light-emitting diode (OLED) 100, according to an exemplary embodiment of the present invention. The OLED 100 includes an anode 110, a first hole injection layer (HIL) 120, a first hole transport layer (HTL) 130, a second hole injection layer 140, an emission layer (EML) 150, an electron transport layer (ETL) 160. The electron transport layer (ETL) 160 is formed directly on the EML 150. Onto the electron transport layer (En) 160, an electron injection layer (EIL) 180 is disposed. The cathode 190 is disposed directly onto the electron injection layer (EIL) 180.

Instead of a single electron transport layer 160, optionally an electron transport layer stack (ETL) can be used.

Figure 2:
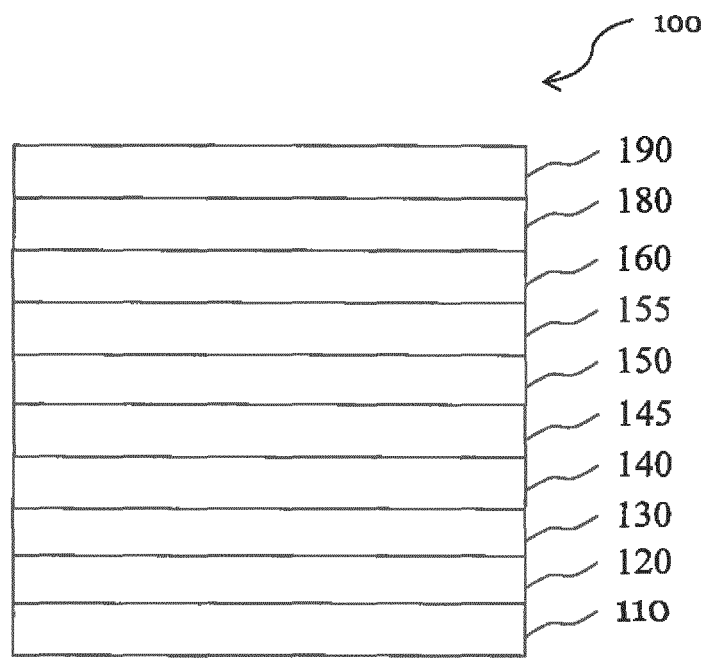
FIG. 2 is a schematic sectional view of an OLED, according to an exemplary embodiment of the present invention.

FIG. 2 is a schematic sectional view of an OLED 100, according to another exemplary embodiment of the present invention. FIG. 2 differs from FIG. 1 in that the OLED 100 of FIG. 2 comprises a second hole transport layer 145 and a hole blocking layer (HBL) 155.

Referring to FIG. 2, the OLED 100 includes an anode no, a first hole injection layer (HIL) 120, a first hole transport layer (HTL) 130, a second hole injection layer 140, second hole transport layer 145, an emission layer (EML) 150, a hole blocking layer (HBL) 155, an electron transport layer (En) 160, an electron injection layer (EIL) 180 and a cathode electrode 190.

Figure 3:
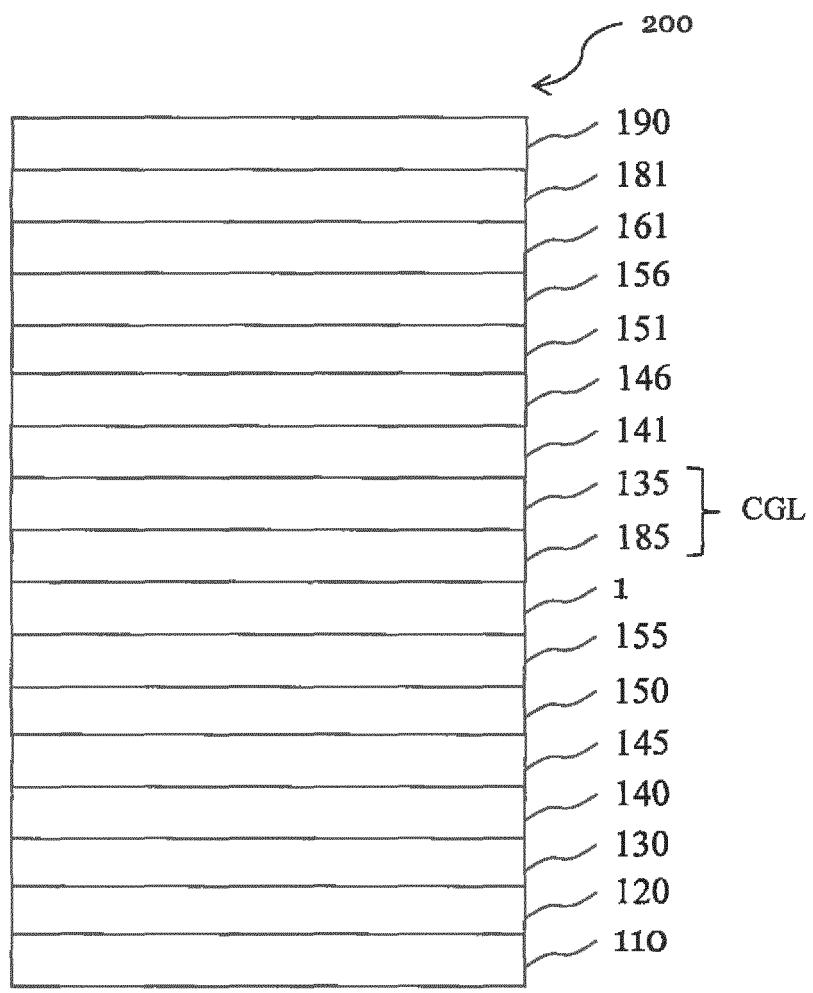
FIG. 3 is a schematic sectional view of a tandem OLED comprising a charge generation layer, according to an exemplary embodiment of the present invention.

FIG. 3 is a schematic sectional view of a tandem OLED 200, according to another exemplary embodiment of the present invention. FIG. 3 differs from FIG. 2 in that the OLED 100 of FIG. 3 further comprises a charge generation layer and a second emission layer.

Referring to FIG. 3, the OLED 200 includes an anode no, a first hole injection layer (HIL) 120, a first hole transport layer (HTL) 130, a second hole injection layer 140, a second hole transport layer 145, a first emission layer (EML) 150, a first hole blocking layer (HBL) 155, a first electron transport layer (ETL) 160, an n-type charge generation layer (n-type CGL) 185, a hole generating layer (p-type charge generation layer; p-type GCL) 135, a third hole transport layer (HTL) 141, a fourth hole transport layer 146, a second emission layer (EML) 151, a second hole blocking layer (EBL) 156, a second electron transport layer (ETL) 161, a second electron injection layer (EIL) 181 and a cathode 190.

While not shown in FIG. 1, FIG. 2 and FIG. 3, a sealing layer may further be formed on the cathode electrodes 190, in order to seal the OLEDs 100 and 200. Likewise, while also not shown in FIG. 1, FIG. 2 and FIG. 3, the layers, beginning with the anode, may be formed on a substrate adjacent to the anode. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

Experimental Part

Supporting Materials for Device Experiments
F1 is

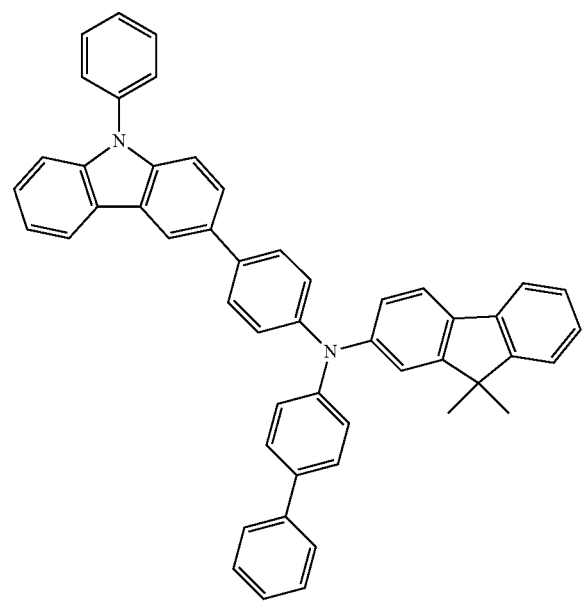 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

N-([1,1'-biphenyl]-4-yl)-9,9-dimethyl-N-(4-(9-phenyl-9H-carbazol-3-yl)phenyl)-9H-fluoren-2-amine, CAS 1242056-42-3;

F2 is

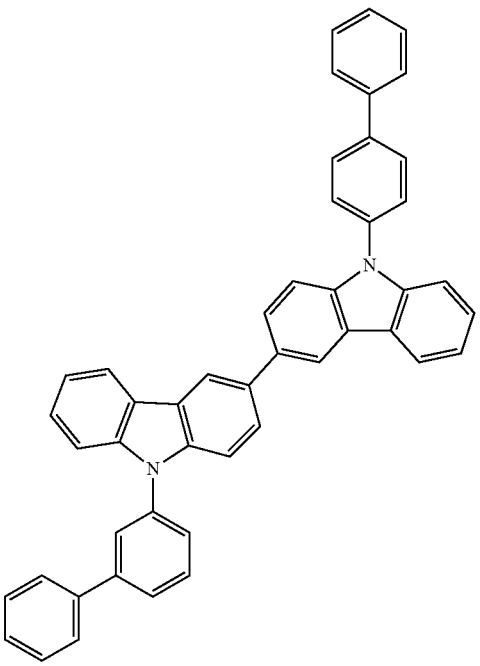 [SMILES: c1ccc(-c2ccc(-n3c4ccccc4c4cc(-c5ccc6c(c5)c5ccccc5n6-c5cccc(-c6ccccc6)c5)ccc43)cc2)cc1]

9-([1,1'-biphenyl]-3-yl)-9'-([1,1'-biphenyl]-4-yl)-9H,9'H-3,3'-bicarbazole, CAS 1643479-47-3;

F3 is

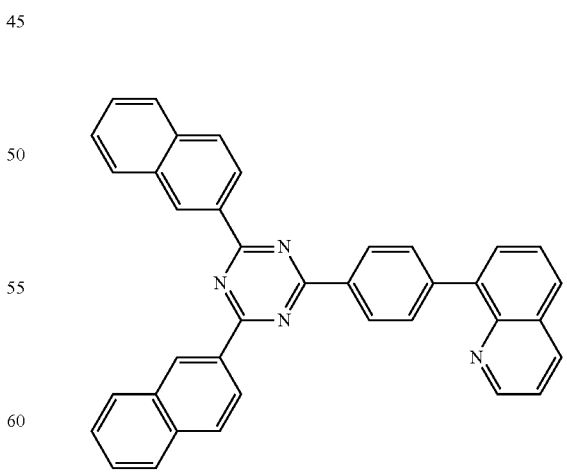

8-(4-(4,6-di(naphthalen-2-yl)-1,3,5-triazin-2-yl)phenyl)quinoline, CAS 1312928-44-1;

F4 is

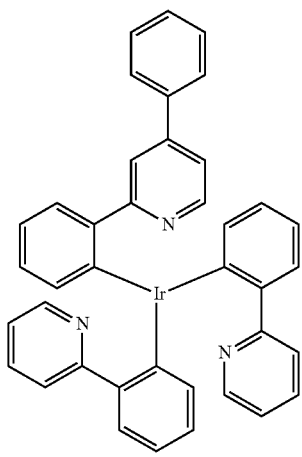

(2-(4-phenylpyridin-2-yl)phenyl)bis(2-(pyridin-2-yl)phenyl)iridium, CAS 1215281-24-5;

F5 is

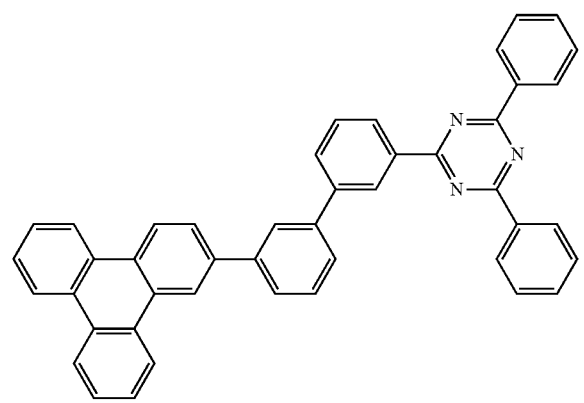 [SMILES: c1ccc(-c2nc(-c3ccccc3)nc(-c3cccc(-c4cccc(-c5ccc6c7ccccc7c7ccccc7c6c5)c4)c3)n2)cc1]

2,4-diphenyl-6-(3'-(triphenylen-2-yl)-[1,1'-biphenyl]-3-yl)-1,3,5-triazine, CAS 1638271-85-8;

F6 is

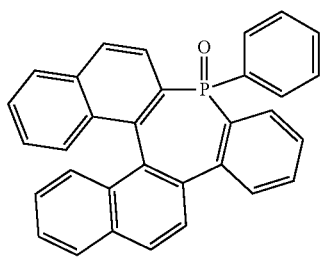 [SMILES: O=P1(c2ccccc2)c2ccccc2-c2ccc3ccccc3c2-c2c1ccc1ccccc21]

3-phenyl-3H-benzo[b]dinaphtho[2,1-d:1',2'-f]phosphepine-3-oxide, CAS 597578-38-6;

GHM020S is an emitter host and EL-GD0108S is a green phosphorescent emitter dopant, both commercially available from SDI, Korea.

ITO is indium tin oxide.

Standard Procedures

Voltage Stability

OLEDs are driven by constant current circuits. Those circuits can supply a cons current over a given voltage range. The wider the voltage range, the wider the power losses of such devices. Hence, the change of driving voltage upon driving needs to be minimized.

The driving voltage of an OLED is temperature dependent. Therefore, voltage stability needs to be judged in thermal equilibrium. Thermal equilibrium is reached after one hour of driving.

Voltage stability is measured by taking the difference of the driving voltage after 50 hours and after 1 hour driving at a constant current density. Here, a current density of 30 mA/cm² is used. Measurements are done at room temperature.

$$dU[V]=U(50\ h, 30\ mA/cm^2)-U(1\ h, 30\ mA/cm^2)$$

EXAMPLES

1) Green phosphorescent OLED comprising the second hole injection layer p-doped with a fluorinated metal complex or with fluorinated fullerene compound Table 1a Schematically Describes the Model Device TABLE 1a

| Material | c [vol %] | d [nm] |
|---|---|---|
| ITO | 100 | 90 |
| F1:PD-2 | 92:8 | 10 |
| F1 | 100 | 130 |
| F2:p-dopant | (100 − x) x | 10 |
| F2 | 100 | 20 |
| GHM020S:EL-GD0108S | 90:10 | 40 |
| F3:LiQ | 50:50 | 36 |
| Al | 100 | 100 |

The results are given in Table 1b

TABLE 1b

| p-dopant | c [vol %] | U (10 mA/cm²) | EQE (10 mA/cm²) [%] | CIE-y |
|---|---|---|---|---|
| PD1 | 1 | 4.5 | 19.7 | 0.619 |
| PD2 | 1 | 4.3 | 19.3 | 0.628 |
| PD2 | 5 | 4.2 | 18.2 | 0.626 |
| PD2 | 10 | 4.2 | 18.1 | 0.625 |
| $C_{60}F_{48}$ | 1 | 4.2 | 19.5 | 0.619 |
| E1 | 5 | 4.2 | 19.2 | 0.627 |
| E1 | 10 | 4.2 | 19.3 | 0.628 |
| E1 | 20 | 4.3 | 19.5 | 0.628 |
| E2 | 5 | 4.2 | 19.0 | 0.626 |
| E2 | 10 | 4.2 | 19.1 | 0.626 |
| E2 | 20 | 4.2 | 19.3 | 0.626 |

In comparison with state-of-art nitrile compounds PD1 and PD2, alternative dopants E1, E2 and $C_{60}F_{48}$ enable comparable efficiency at lower operational voltage or higher efficiency at comparable voltage.

2) Yellow phosphorescent OLED comprising the second hole injection layer p-doped with a fluorinated metal complex or with fluorinated fullerene compound Table 2a Schematically Describes the Model Device TABLE 2a

| Material | c [vol %] | d [nm] |
|---|---|---|
| ITO | 100 | 90 |
| F1:PD2 | 92:8 | 10 |
| F1 | 100 | 145 |
| F2:p-dopant | (100 − x):x | 10 |
| F2 | 100 | 20 |
| GHM020S:F4 | 90:10 | 40 |
| F5 | 100 | 25 |
| F6:Yb | 99:1 | 10 |
| Al | 100 | 100 |

The results are given in Table 2b

TABLE 2b

| p-dopant | c [vol %] | U (10 mA/cm$^2$) [V] | EQE (10 mA/cm$^2$) [%] | CIE-y |
|---|---|---|---|---|
| PD1 | 1 | 5.3 | 20.6 | 0.561 |
| C$_{60}$F$_{48}$ | 1 | 5.0 | 20.8 | 0.561 |

In comparison with state-of-art nitrite compo d PD1, alternative dopant C$_{60}$F$_{48}$ enables higher efficiency at lower operational voltage.

The features disclosed in the foregoing description, in the claims and the accompanying drawings may, both separately or in any combination be material for realizing the invention in diverse forms thereof.

Key symbols and abbreviations used throughout the application:
CV cyclic voltammetry
DSC differential scanning calorimentry
EBL electron blocking layer
EIL electron injecting layer
EML emitting layer
eq. equivalent
ETL electron transport layer
ETM electron transport matrix
Fc ferrocene
Fc+ ferricenium
HBL hole blocking layer
HIL hole injecting layer
HOMO highest occupied molecular orbital
HPLC high performance liquid chromatography
HTL hole transport layer
p-HTL p-doped hole transport layer
HTM hole transport matrix
ITO indium tin oxide
LUMO lowest unoccupied molecular orbital
mol % molar percent
NMR nuclear magnetic resonance
OLED organic light emitting diode
OPV organic photovoltaics
PTFE polytetrafluoroethylene
QE quantum efficiency
R$_f$ retardation factor in TLC
RGB red-green-blue
TCO transparent conductive oxide
TFT thin film transistor
T$_g$ glass transition temperature
TLC thin layer chromatography
vacuum thermal evaporation
wt % weight percent

The invention claimed is:

1. Organic light emitting device comprising:
   (i) an anode;
   (ii) a cathode;
   (iii) at least one light emitting layer arranged between the anode and the cathode;
   (iv) optionally a first hole injection layer comprising a first hole injection compound, the first hole injection layer being arranged between the anode and the light emitting layer and the hole injection layer being adjacent to the anode;
   (v) a first hole transport layer comprising a first hole transport matrix compound, wherein the first hole transport layer is arranged
      a) between the first hole injection layer and the light emitting layer and adjacent to the first hole injection layer; or
      b) between the anode and the light emitting layer and adjacent to the anode;
   (vi) a second hole injection layer arranged between the first hole transport layer and the light emitting layer, wherein the second hole injection layer is adjacent to the first hole transport layer and wherein the second hole injection layer comprises a second hole injection compound;
   wherein the second hole injection compound is a halogenated fullerene, a partially or fully halogenated metal complex or a mixture thereof; and
   the halogenated fullerene has the formula C$_x$F$_y$ wherein x is an even integer from 60 to 120 and y is from x/2 to 4x/5.

2. The organic light emitting device according to claim 1 wherein the first hole injection layer further comprises a second hole transport matrix compound.

3. The organic light emitting device according to claim 1, wherein the second hole injection layer further comprises a third hole transport matrix compound.

4. The organic light emitting device according to claim 1, wherein the organic light emitting device further comprises a second hole transport layer arranged between the second hole injection layer and the light emitting layer, wherein the second hole transport layer is adjacent to the second hole injection layer and wherein the second hole transport layer comprises a fourth hole transport matrix compound.

5. The organic light emitting device according to claim 1, wherein the partially or fully halogenated metal complex is a partially or fully fluorinated metal complex.

6. The organic light emitting device according to claim 1, wherein x is 60.

7. The organic light emitting device according to claim 1, wherein the halogenated fullerene has the formula C$_{60}$F$_{48}$.

8. The organic light emitting diode according to claim 1, wherein the halogenated metal complex has the following formula (I)

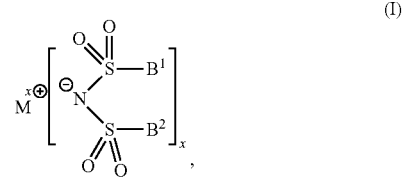

(I)

wherein $M^{x\oplus}$ is a x-valent cation of a metal selected from alkali metals, alkaline earth metals, rare earth metals and Al, Ga, In, Sn, Pb, Ti, Zr, Hf, V, Nb, Ta, Cr, Mo, W, Mn, Fe, Co, Ni, Zn and Cd;

x is 1 for M selected from alkali metals; 2 for M selected from alkaline earth metals, Pb, Mn, Fe, Co, Ni, Zn and Cd; 2 or 3 for M selected from rare earth metals; 3 for Al, Ga, In; 2, 3 or 4 for Ti, Zr, Hf, V, Nb, Ta, Cr, Mo, W; and 2 or 4 for Sn;

$B^1$ and $B^2$ is independently selected from partially or fully halogenated $C_3$ to $C_{20}$ alkyl, $C_3$ to $C_{20}$ cycloalkyl or $C_3$ to $C_{20}$ arylalkyl.

9. The organic light emitting device according to claim 1, wherein the light emitting layer comprises a phosphorescent emitter.

10. Organic light emitting device comprising:
(i) an anode;
(ii) a cathode;
(iii) at least one light emitting layer arranged between the anode and the cathode;
(iv) optionally a first hole injection layer comprising a first hole injection compound, the first hole injection layer being arranged between the anode and the light emitting layer and the hole injection layer being adjacent to the anode;
(v) a first hole transport layer comprising a first hole transport matrix compound, wherein the first hole transport layer is arranged
  a) between the first hole injection layer and the light emitting layer and adjacent to the first hole injection layer; or
  b) between the anode and the light emitting layer and adjacent to the anode;
(vi) a second hole injection layer arranged between the first hole transport layer and the light emitting layer, wherein the second hole injection layer is adjacent to the first hole transport layer and wherein the second hole injection layer comprises a second hole injection compound;

wherein the second hole injection compound is a halogenated fullerene, a partially or fully halogenated metal complex or a mixture thereof;

wherein the halogenated metal complex has the following formula (I)—

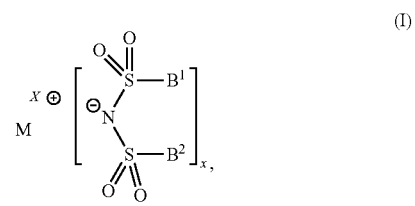

wherein $M^{x\oplus}$ is a x-valent cation of a metal selected from alkali metals, alkaline earth metals, rare earth metals and Al, Ga, In, Sn, Pb, Ti, Zr, Hf, V, Nb, Ta, Cr, Mo, W, Mn, Fe, Co, Ni, Zn and Cd;

x is 1 for M selected from alkali metals; 2 for M selected from alkaline earth metals, Pb, Mn, Fe, Co, Ni, Zn and Cd; 2 or 3 for M selected from rare earth metals; 3 for Al, Ga, In; 2, 3 or 4 for Ti, Zr, Hf, V, Nb, Ta, Cr, Mo, W; and 2 or 4 for Sn;

$B^1$ and $B^2$ is independently selected from partially or fully halogenated $C_3$ to $C_{20}$ alkyl, $C_3$ to $C_{20}$ cycloalkyl or $C_3$ to $C_{20}$ arylalkyl.

\* \* \* \* \*